United States Patent
Bonwick et al.

(10) Patent No.: US 7,281,188 B1
(45) Date of Patent: Oct. 9, 2007

(54) METHOD AND SYSTEM FOR DETECTING AND CORRECTING DATA ERRORS USING DATA PERMUTATIONS

(75) Inventors: Jeffrey S. Bonwick, Los Altos, CA (US); Matthew A. Ahrens, San Francisco, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 521 days.

(21) Appl. No.: 10/853,870

(22) Filed: May 26, 2004

(51) Int. Cl.
*H03M 13/00* (2006.01)
(52) U.S. Cl. .................. 714/752; 714/755; 714/758
(58) Field of Classification Search .............. 714/752, 714/758, 755, 785, 6, 788, 799
See application file for complete search history.

(56) References Cited

U.S. PATENT DOCUMENTS

| | | | |
|---|---|---|---|
| 4,144,522 A * | 3/1979 | Kageyama et al. ......... 714/748 |
| 5,155,847 A * | 10/1992 | Kirouac et al. ............ 709/221 |
| 5,371,885 A | 12/1994 | Letwin | |
| 5,819,292 A | 10/1998 | Hitz et al. | |
| 6,209,111 B1 * | 3/2001 | Kadyk et al. .............. 714/747 |
| 6,745,284 B1 | 6/2004 | Lee et al. | |
| 6,745,305 B2 | 6/2004 | McDowell | |
| 7,007,196 B2 | 2/2006 | Lee et al. | |
| 7,032,154 B2 * | 4/2006 | Kidorf et al. .............. 714/755 |
| 7,043,677 B1 | 5/2006 | Li | |
| 2002/0004883 A1 | 1/2002 | Nguyen et al. | |
| 2002/0055942 A1 | 5/2002 | Reynolds | |
| 2002/0087788 A1 | 7/2002 | Morris | |
| 2002/0161972 A1 | 10/2002 | Talagala et al. | |
| 2003/0033477 A1 | 2/2003 | Johnson et al. | |
| 2003/0126107 A1 | 7/2003 | Yamagami | |
| 2003/0145167 A1 | 7/2003 | Tomita | |
| 2004/0098720 A1 | 5/2004 | Hooper | |
| 2004/0107314 A1 | 6/2004 | Kim et al. | |
| 2004/0123063 A1 | 6/2004 | Dalal et al. | |
| 2004/0225834 A1 | 11/2004 | Lu et al. | |
| 2004/0234000 A1 * | 11/2004 | Page ......................... 375/259 |
| 2005/0097270 A1 | 5/2005 | Kleiman et al. | |
| 2005/0235154 A1 | 10/2005 | Serret-Avila | |
| 2006/0218644 A1 | 9/2006 | Niles et al. | |

OTHER PUBLICATIONS

Goodheart, et al.; "The Magic Garden Explained"; Prentice Hall, pp. 24-25, 29-30, 390-391; 1994 (8 pages).
Austin, B. J.: "*A Dynamic Disc Allocation Algorithm Designed to Reduce Fragmentation During File Reloading*"; pp. 378-381; 1970 (4 pages).
Stallings, W.; *Computer Organization and Architecture: Designing for Performance*:; Prentice Hall, Fifth Edition; pp. 377-378; 2000 (4 pages).

* cited by examiner

*Primary Examiner*—Guy Lamarre
*Assistant Examiner*—Fritz Alphonse
(74) *Attorney, Agent, or Firm*—Osha Liang LLP

(57) ABSTRACT

A method for correcting an error in a first block including detecting an error in the first block, generating a first permutation of the first block, calculating a first permutation checksum for the first permutation of the first block, and replacing the first block with the first permutation of the first block, if a first block checksum matches the first permutation checksum.

23 Claims, 9 Drawing Sheets

METHOD AND SYSTEM FOR DETECTING AND CORRECTING DATA ERRORS USING DATA PERMUTATIONS

BACKGROUND

A typical operating system includes a file system. The file system provides a mechanism for the storage and retrieval of files and a hierarchical directory structure for the naming of multiple files. More specifically, the file system stores information provided by the user (i.e., data) and information describing the characteristics of the data (i.e., metadata). The file system also provides extensive programming interfaces to enable the creation and deletion of files, reading and writing of files, performing seeks within a file, creating and deleting directories, managing directory contents, etc. In addition, the file system also provides management interfaces to create and delete file systems. File systems are typically controlled and restricted by operating system parameters. For example, most operating systems limit the maximum number of file names that can be handled within their file system. Some operating systems also limit the size of files that can be managed under a file system.

To access a file, the operating system (via the file system) typically provides file manipulation interfaces to open, close, read, and write the data within each file. An application, which may reside on the local system (i.e., computer) or may be located on a remote system, uses files as an abstraction to address data. Conventionally, this data is stored on a storage device, such as a disk. The file system stores data on the storage device by managing the allocation of space within the storage device.

Typically, the volume manager provides space, which is managed by the file system. Two common types of file system space allocation strategies are known as block-based allocation and extent-based allocation. Block-based allocation creates incremental disk space for each file each time the file is extended (i.e., modified via a write request to add information), whereas extent-based allocation creates a large series of contiguous blocks (i.e., extents) each time the file exhausts the space available in the file's last extent.

When allocating space, both block-based and extent-based allocation use space provided by the volume manager. The volume manager allows multiple physical disks to be used as a single volume (i.e., a virtual disk) to provide larger consolidated storage sizes and simpler management. The volume manager allows users to organize data along volume boundaries (i.e., each volume has physical disk space allocated to the volume such that the volume is tied only to that dedicated physical disk). The volume manager is typically implemented as a separate layer between the physical disks and the file system, and is presented to the user as a virtual disk device. In other words, volume managers organize the collections of physical devices (e.g., disks) into virtual devices. Additionally, the space allocated within the volume manager is handled by the file system. Consequently, the volume manager is not aware of which blocks within the available storage space are in use and which blocks are free for data to be stored.

Further, file systems may be mounted on the virtual disk devices. Thus, physical disks are partitioned and allocated to multiple virtual disk devices, and each virtual disk device is capable of having a file system that exclusively uses that particular virtual disk device. A request to access a file is typically performed by an application, via the file system, using a file name and logical offset. This file name and logical offset (i.e., the manner in which applications express file operation requests) corresponds to a location within the virtual disk device. Subsequently, the request is translated to physical disk space on the storage device by the volume manager, allowing the user of the application to access the data within a particular file.

Files systems and/or volume managers may include a mechanism for determining whether the data stored within the file system has been corrupted (or otherwise altered). One such mechanism is a checksum, which corresponds to a set of bits obtained by applying a particular formula (e.g., Message Digest 5 (MD5), Fletcher, Cyclic Redundancy Check (CRC), etc.) to the piece of data. The checksum for the particular piece of data is then stored adjacent to the corresponding data in the file system (e.g., using 520 byte sectors).

SUMMARY

In general, in one aspect, the invention relates to a method for correcting an error in a first block comprising detecting an error in the first block, generating a first permutation of the first block, calculating a first permutation checksum for the first permutation of the first block, and replacing the first block with the first permutation of the first block, if a first block checksum matches the first permutation checksum.

In general, in one aspect, the invention relates to a method for retrieving data in a data block, comprising obtaining an indirect block comprising a stored checksum and a data block location, obtaining the data block using the data block location, calculating the checksum for the data block to obtain a calculated checksum, retrieving the data from the data block, if the stored checksum equals the calculated checksum, and performing error correction, if the stored checksum is not equal to the calculated checksum.

In general, in one aspect, the invention relates to a system for correcting an error in a first block, comprising a storage pool comprising the first block and a second block, wherein the second block comprises a first block checksum and a first block location, a storage pool allocator configured to store the first block and the second block in the storage pool, and a data management unit configured to correct the error in the first block, if the error is detected, wherein the error in the first block is corrected by generating a permutation of the first block, calculating a permutation checksum, comparing the permutation checksum to the first block checksum, and replacing the first block with the permutation of the first block, if the permutation checksum matches the first block checksum.

In general, in one aspect, the invention relates to a computer system for correcting an error in a first block, comprising a processor, a memory, a storage device, and software instructions stored in the memory for enabling the computer system under control of the processor, to detect an error in the first block, enerate a permutation of the first block, calculate a permutation checksum for the permutation of the first block, and replace the first block with the permutation of the first block, if a first block checksum matches the permutation checksum.

In general, in one aspect, the invention relates to a network system having a plurality of nodes, comprising a storage pool comprising the first block and a second block, wherein the second block comprises a first block checksum and a first block location, a storage pool allocator configured to store the first block and the second block in the storage pool, and a data management unit configured to correct the error in the first block, if the error is detected, wherein the error in the first block is corrected by generating a permutation of the first block, calculating a permutation checksum, comparing the permutation checksum to the first block checksum, and replacing the first block with the permutation of the first block if the permutation checksum matches the first block checksum, wherein the storage pool is located on any one of the plurality of nodes, and wherein the storage pool allocator is located on any one of the plurality of nodes.

Other aspects of the invention will be apparent from the following description and the appended claims.

DETAILED DESCRIPTION

Figure 1:
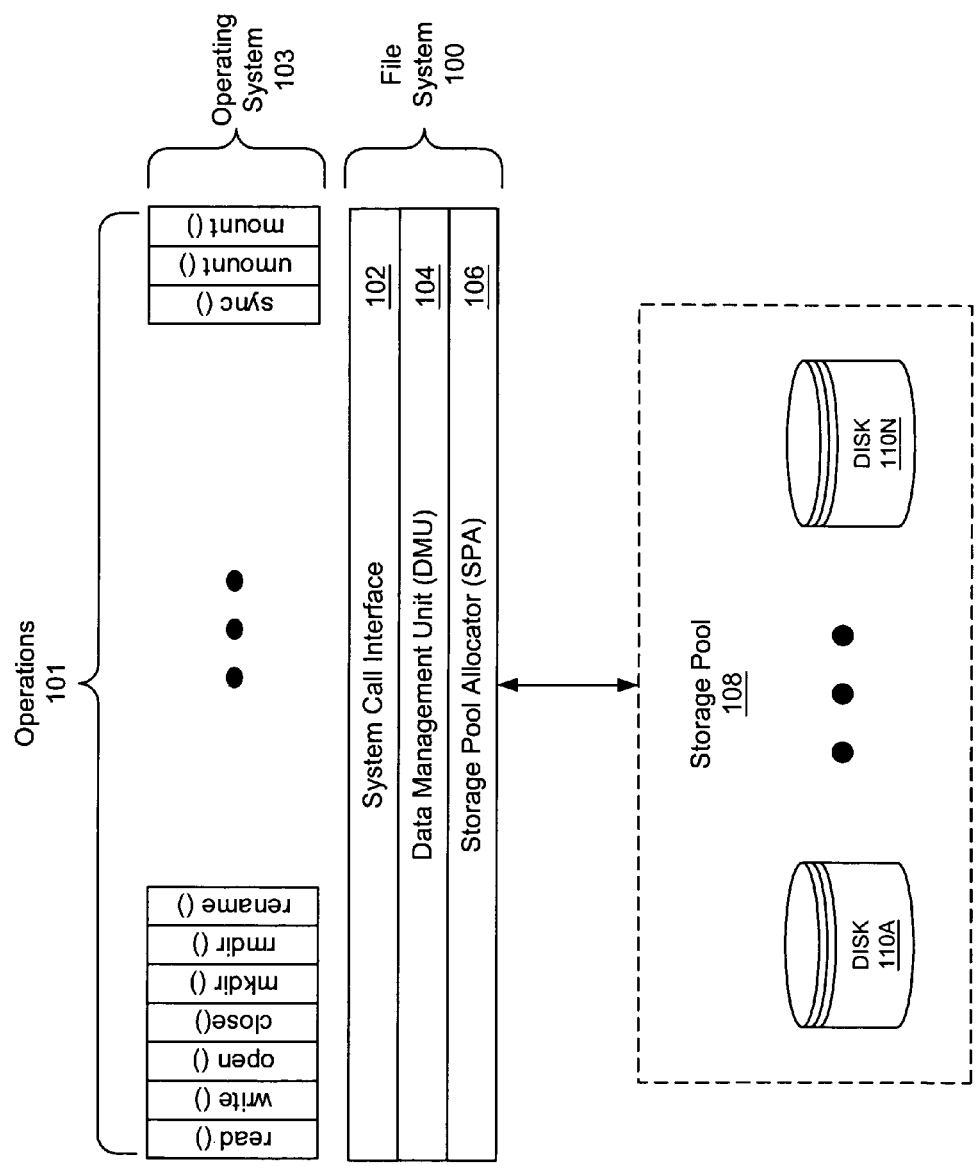
FIG. 1 shows a system architecture in accordance with an embodiment of the invention.

Exemplary embodiments of the invention will be described with reference to the accompanying drawings. Like items in the drawings are shown with the same reference numbers. Further, the use of "ST" in the drawings is equivalent to the use of "Step" in the detailed description below.

In an embodiment of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

In general, embodiments of the invention relate to a method for detecting and correcting data corruption or data errors in a file system. More specifically, embodiments of the invention use checksums to detect data errors and data permutations to correct data errors.

FIG. 1 shows a system architecture in accordance with one embodiment of the invention. The system architecture includes an operating system (103) interacting with a file system (100), which interfaces with a storage pool (108). In one embodiment of the invention, the file system (100) includes a system call interface (102), a data management unit (DMU) (104), and a storage pool allocator (SPA) (106).

The operating system (103) typically interfaces with the file system (100) via a system call interface (102). The operating system (103) provides operations (101) for users to access files within the file system (100). These operations (101) may include read, write, open, close, etc. In one embodiment of the invention, the file system (100) is an object-based file system (i.e., both data and metadata are stored as objects). More specifically, the file system (100) includes functionality to store both data and corresponding metadata in the storage pool (108). Thus, the aforementioned operations (101) provided by the operating system (103) correspond to operations on objects.

More specifically, in one embodiment of the invention, a request to perform a particular operation (101) (i.e., a transaction) is forwarded from the operating system (103), via the system call interface (102), to the DMU (104). In one embodiment of the invention, the DMU (104) translates the request to perform an operation on an object directly to a request to perform a read or write operation at a physical location within the storage pool (108). More specifically, the DMU (104) represents the objects as data blocks and indirect blocks (as described in FIG. 3 below). Additionally, in one embodiment of the invention, the DMU (104) includes functionality to group related work (i.e., modifications to data blocks and indirect blocks) into I/O requests allowing related blocks to be forwarded to the SPA (106) together. The SPA (106) receives transactions from the DMU (106) and subsequently writes the blocks into the storage pool (108). The operation of the SPA (106) is described in FIG. 2 below.

In one embodiment of the invention, the storage pool (108) includes one or more physical disks (disks (110A-110N)). Further, in one embodiment of the invention, the storage capacity of the storage pool (108) may increase and decrease dynamically as physical disks are added and removed from the storage pool. In one embodiment of the invention, the storage space available in the storage pool (108) is managed by the SPA (106).

Figure 2:
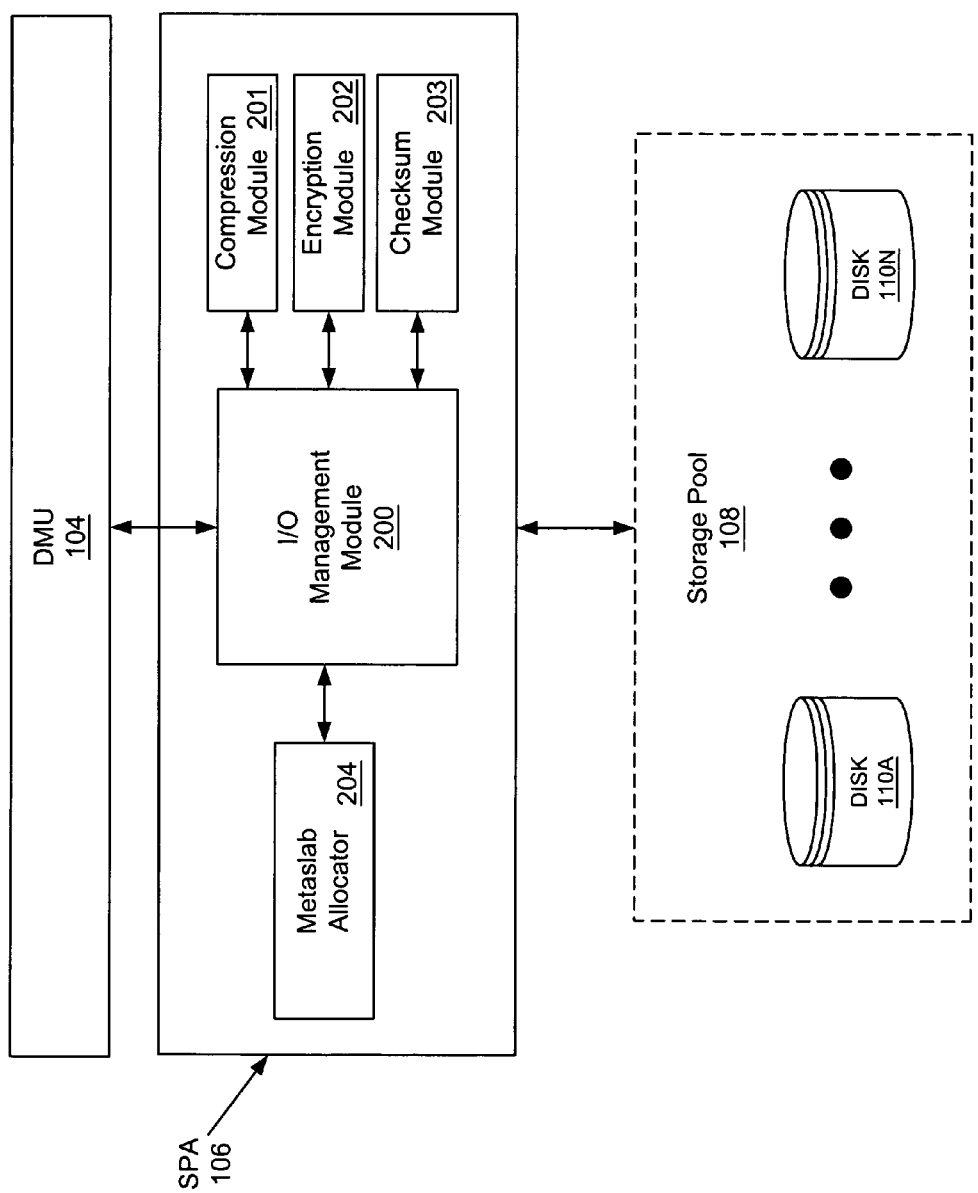
FIG. 2 shows a storage pool allocator in accordance with an embodiment of the invention.

FIG. 2 shows the SPA (106) in accordance with one embodiment of the invention. The SPA (106) may include an I/O management module (200), a compression module (201), an encryption module (202), a checksum module (203), and a metaslab allocator (204). Each of these aforementioned modules is described in detail below.

As noted above, the SPA (106) receives transactions from the DMU (104). More specifically, the I/O management module (200), within the SPA (106), receives transactions from the DMU (104) and groups the transactions into transaction groups in accordance with one embodiment of the invention. The compression module (201) provides functionality to compress larger logical blocks (i.e., data blocks and indirect blocks) into smaller segments, where a segment is a region of physical disk space. For example, a logical block size of 8 K bytes may be compressed to a size of 2 K bytes for efficient storage. Further, in one embodiment of the invention, the encryption module (202) provides various data encryption algorithms. The data encryption algorithms may be used, for example, to prevent unauthorized access. In one embodiment of the invention, the checksum module (203) includes functionality to calculate a checksum for data (i.e., data stored in a data block) and metadata (i.e., data stored in an indirect block) within the storage pool. The checksum may be used, for example, to ensure data has not been corrupted.

As discussed above, the SPA (106) provides an interface to the storage pool and manages allocation of storage space within the storage pool (108). More specifically, in one embodiment of the invention, the SPA (106) uses the metaslab allocator (204) to manage the allocation of storage space in the storage pool (108).

In one embodiment of the invention, the storage space in the storage pool is divided into contiguous regions of data, i.e., metaslabs. The metaslabs may in turn be divided into segments (i.e., portions of the metaslab). The segments may all be the same size, or alternatively, may be a range of sizes. The metaslab allocator (204) includes functionality to allocate large or small segments to store data blocks and indirect blocks. In one embodiment of the invention, allocation of the segments within the metaslabs is based on the size of the blocks within the I/O requests. That is, small segments are allocated for small blocks, while large segments are allocated for large blocks.

The allocation of segments based on the size of the blocks may allow for more efficient storage of data and metadata in the storage pool by reducing the amount of unused space within a given metaslab. Further, using large segments for large blocks may allow for more efficient access to data (and metadata) by reducing the number of DMU (104) translations and/or reducing the number of I/O operations. In one embodiment of the invention, the metaslab allocator may include a policy that specifies a method to allocate segments.

Figure 3:
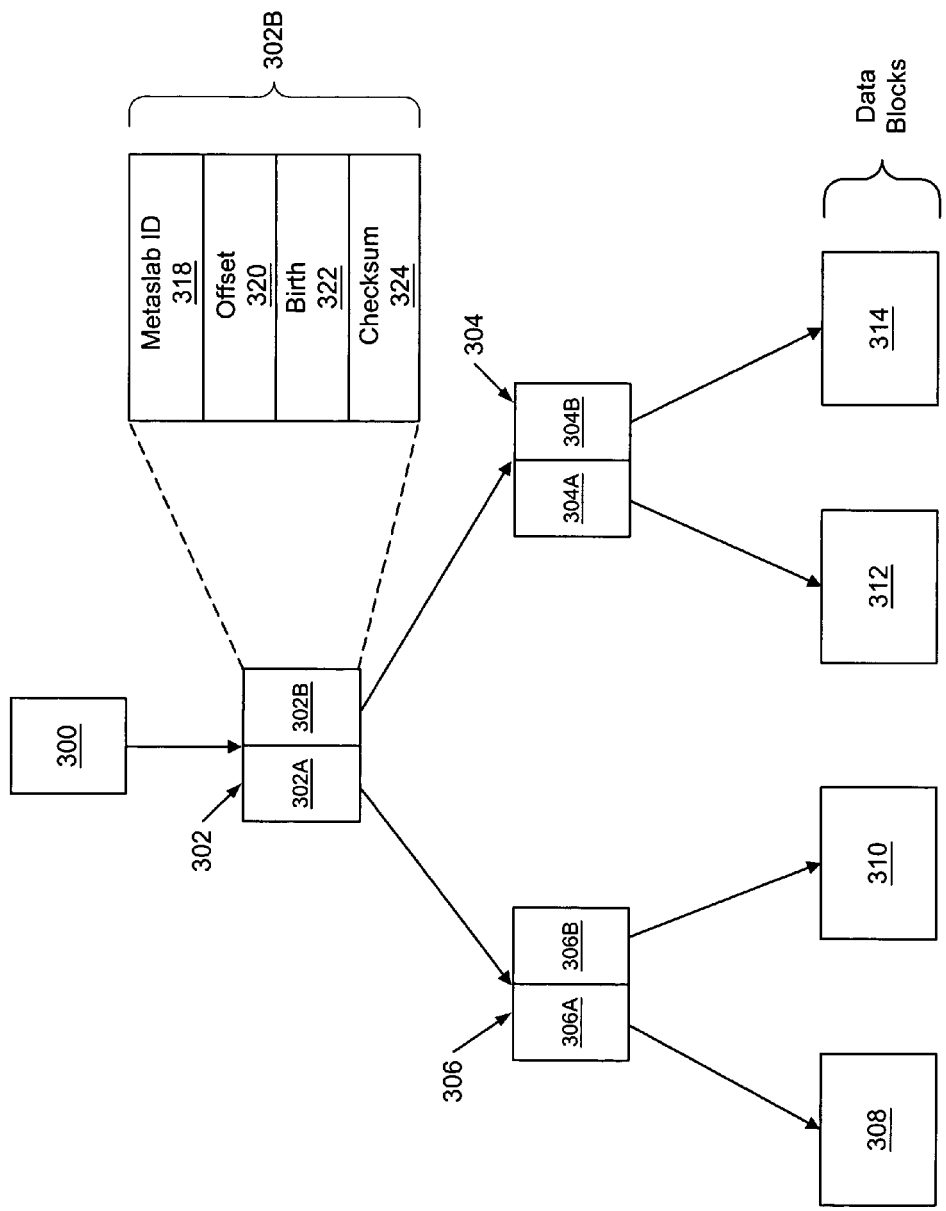
FIG. 3 shows a hierarchical data configuration in accordance with an embodiment of the invention.

As noted above, the storage pool (108) is divided into metaslabs, which are further divided into segments. Each of the segments within the metaslab may then be used to store a data block (i.e., data) or an indirect block (i.e., metadata). FIG. 3 shows the hierarchical data configuration (hereinafter referred to as a "tree") for storing data blocks and indirect blocks within the storage pool in accordance with one embodiment of the invention. In one embodiment of the invention, the tree includes a root block (300), one or more levels of indirect blocks (302, 304, 306), and one or more data blocks (308, 310, 312, 314). In one embodiment of the invention, the location of the root block (300) is in a particular location within the storage pool.

The root block (300) typically points to subsequent indirect blocks (302, 304, and 306). In one embodiment of the invention, indirect blocks (302, 304, and 306) may be arrays of block pointers (e.g., 302A, 302B, etc.) that, directly or indirectly, reference to data blocks (308, 310, 312, and 314). The data blocks (308, 310, 312, and 314) contain actual data of files stored in the storage pool. One skilled in the art will appreciate that several layers of indirect blocks may exist between the root block (300) and the data blocks (308, 310, 312, 314).

In contrast to the root block (300), indirect blocks and data blocks may be located anywhere in the storage pool (108 in FIG. 1). In one embodiment of the invention, the root block (300) and each block pointer (e.g., 302A, 302B, etc.) includes data as shown in the expanded block pointer (302B). One skilled in the art will appreciate that data blocks do not include this information; rather data blocks contain actual data of files within the file system.

In one embodiment of the invention, each block pointer includes a metaslab ID (318), an offset (320) within the metaslab, a birth value (322) of the block referenced by the block pointer, and a checksum (324) of the data stored in the block (data block or indirect block) referenced by the block pointer. In one embodiment of the invention, the metaslab ID (318) and offset (320) are used to determine the location of the block (data block or indirect block) in the storage pool.

The metaslab ID (318) identifies a particular metaslab. More specifically, the metaslab ID (318) may identify the particular disk (within the storage pool) upon which the metaslab resides and where in the disk the metaslab begins. The offset (320) may then be used to reference a particular segment in the metaslab. In one embodiment of the invention, the data within the segment referenced by the particular metaslab ID (318) and offset (320) may correspond to either a data block or an indirect block. If the data corresponds to an indirect block, then the metaslab ID and offset within a block pointer in the indirect block are extracted and used to locate a subsequent data block or indirect block. The tree may be traversed in this manner to eventually retrieve a requested data block.

In one embodiment of the invention, copy-on-write transactions are performed for every data write request to a file. Specifically, all write requests cause new segments to be allocated for the modified data. Therefore, the retrieved data blocks and indirect blocks are never overwritten (until a modified version of the data block and indirect block is committed). More specifically, the DMU writes out all the modified data blocks in the tree to unused segments within the storage pool. Subsequently, the DMU writes out the corresponding block pointers (within indirect blocks) to unused segments in the storage pool. In one embodiment of the invention, fields (i.e., metaslab ID, offset, birth, checksum) for the corresponding block pointers are populated by the DMU prior to sending an I/O request to the SPA. The indirect blocks containing the block pointers are typically written one level at a time. To complete the copy-on-write transaction, the SPA issues a single write that atomically changes the root block to reference the indirect blocks referencing the modified data block.

Figure 4:
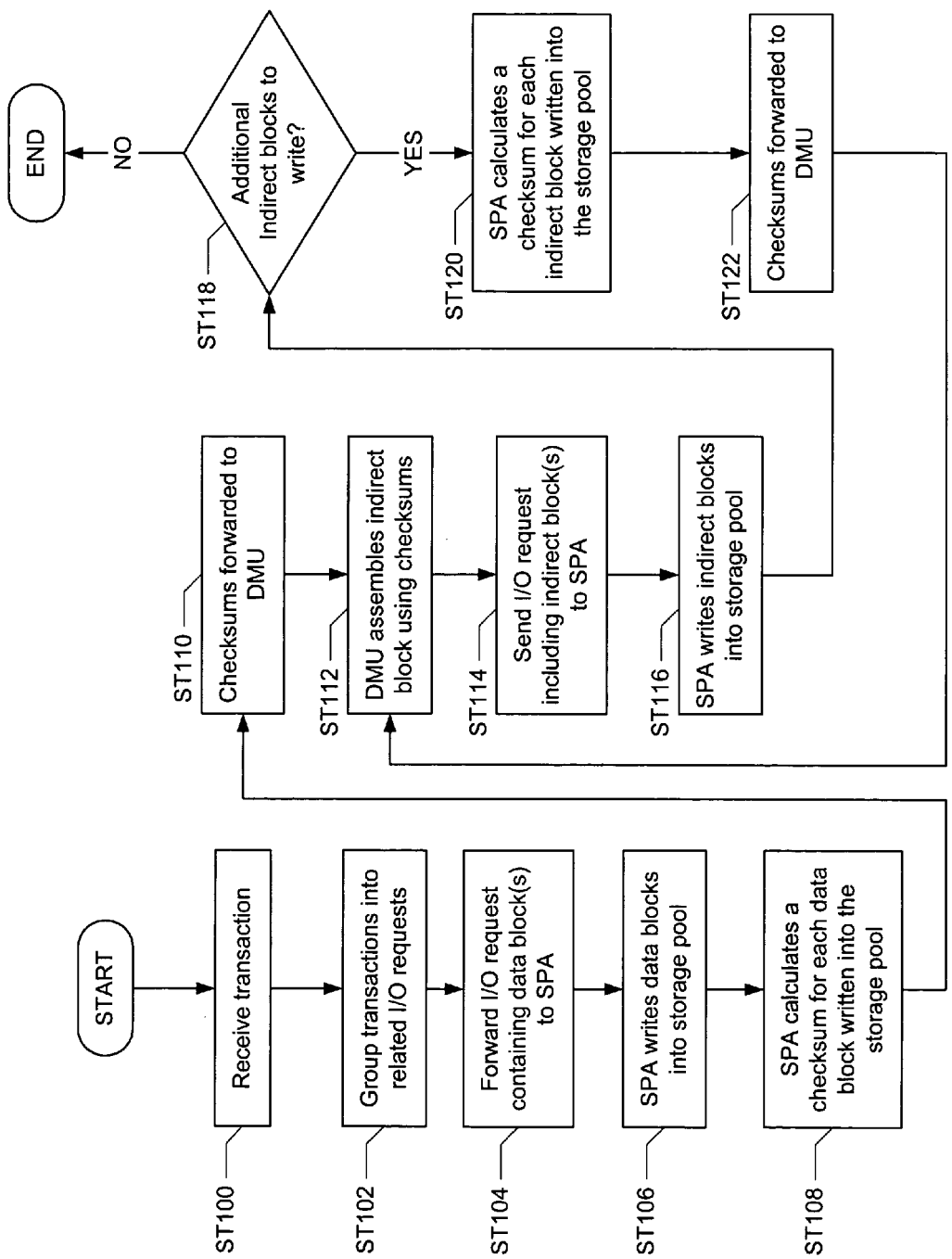
FIG. 4 shows a flow chart in accordance with an embodiment of the invention.

Using the infrastructure shown in FIGS. 1-3, the following discussion describes a method for using data permutations to correct data errors in accordance with one embodiment of the invention. Data errors may occur, for example, due to media errors, disk firmware bugs, etc. FIG. 4 shows a flow chart in accordance with one embodiment of the invention. Initially, the DMU receives a transaction from an application, the operating system (or a subsystem therein), etc. (Step 100). The DMU subsequently groups the transactions into one or more I/O requests (Step 102). The I/O requests are subsequently forwarded to the SPA (Step 104).

In one embodiment of the invention, the transaction includes one or more data blocks, and/or one or more indirect blocks. As noted above, the file system is stored on disk using a hierarchical structure including data blocks and indirect blocks. Thus, for a given set of transactions, the first I/O request includes the data blocks to be written to disk, while subsequent I/O requests include the corresponding indirect blocks containing one or more block pointers. Accordingly, the I/O request referenced in ST 104 includes data blocks.

Continuing with the discussion of FIG. 4, the SPA, upon receiving the I/O request (including data blocks from the DMU), writes the data blocks into the storage pool (Step 106). The SPA subsequently calculates a checksum for each data block written into the storage pool (Step 108). In one embodiment, the checksum module (203 in FIG. 2) within the SPA is used to calculate the checksum for each data block written into the storage pool. The checksums are subsequently forwarded to the DMU (Step 110).

The DMU then assembles the indirect blocks using the checksums (Step 112). Specifically, the DMU places the checksum for a given data block in the appropriate block pointer within the indirect block (i.e., the parent indirect block of the data block). Next, the indirect blocks are forwarded to the SPA (Step 114). Those skilled in the art will appreciate that the aforementioned indirect blocks correspond to the indirect blocks that directly point (via the block pointers) to the data blocks (as opposed to indirect blocks that point to other indirect blocks).

Next, the SPA receives and subsequently writes the indirect blocks into the storage pool (Step 116). A determination is then made whether additional indirect blocks exist to write into the storage pool (i.e., whether the last indirect block written to the storage pool corresponds to the root block)

(Step 118). If no additional indirect blocks exist, then the method is complete. However, if additional indirect blocks exist, then the SPA calculates the checksum from each of the indirect blocks written into the storage pool (Step 120). The checksums for each of the indirect blocks is subsequently sent to the DMU (Step 122). Steps 112-122 are subsequently repeated until the root block is written into the storage pool.

Figure 5:
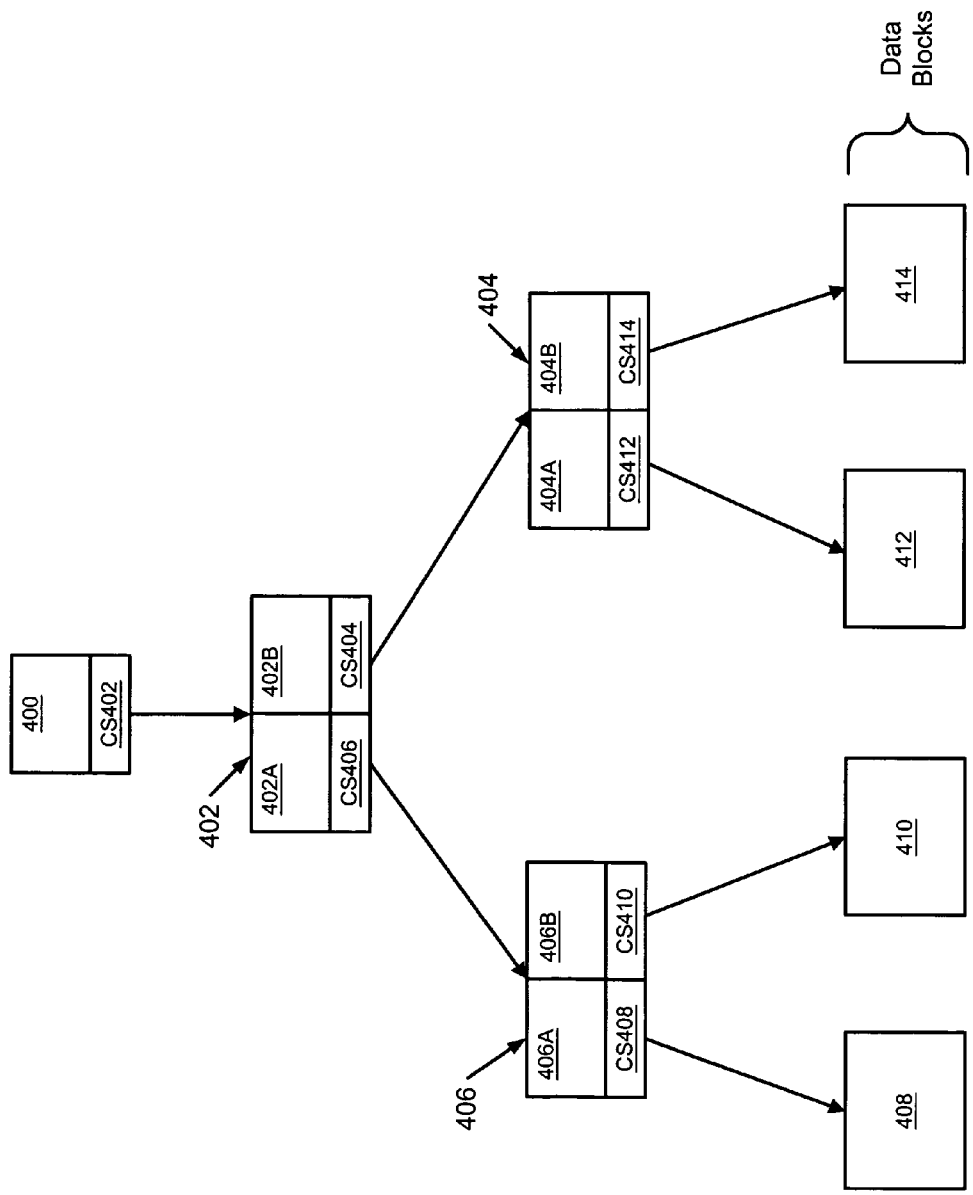
FIG. 5 shows a hierarchical data configuration in accordance with an embodiment of the invention.

FIG. 5 shows a hierarchical data configuration in accordance with an embodiment of the invention. Specifically, FIG. 5 shows a detailed view of the data blocks and indirect blocks resulting from using the method described in FIG. 4, in accordance with one embodiment of the invention. Specifically, the file system includes four data blocks (i.e., 408, 410, 412, and 414). Each data block (408, 410, 412, and 414) within the file system has a corresponding checksum (CS408, CS410, CS412, and CS414, respectively) stored in the corresponding block pointer (406A, 406B, 404A, 404B, respectively).

Each of the block pointers (406A, 406B, 404A, and 404B) is stored in an indirect block (i.e., 404, 406). Each indirect block (404, 406) also has a corresponding checksum (CS404, CS406, respectively) stored in a corresponding block pointer in a parent indirect block (402). Specifically, block pointer (402A) includes the checksum (CS406) for indirect block (406), and block pointer (402B) includes the checksum (CS404) for indirect block (404). In this particular example, the indirect block (402) is referenced by a root block (400). The root block (400) includes the checksum (CS402) for the array of indirect blocks (402).

Figure 6:
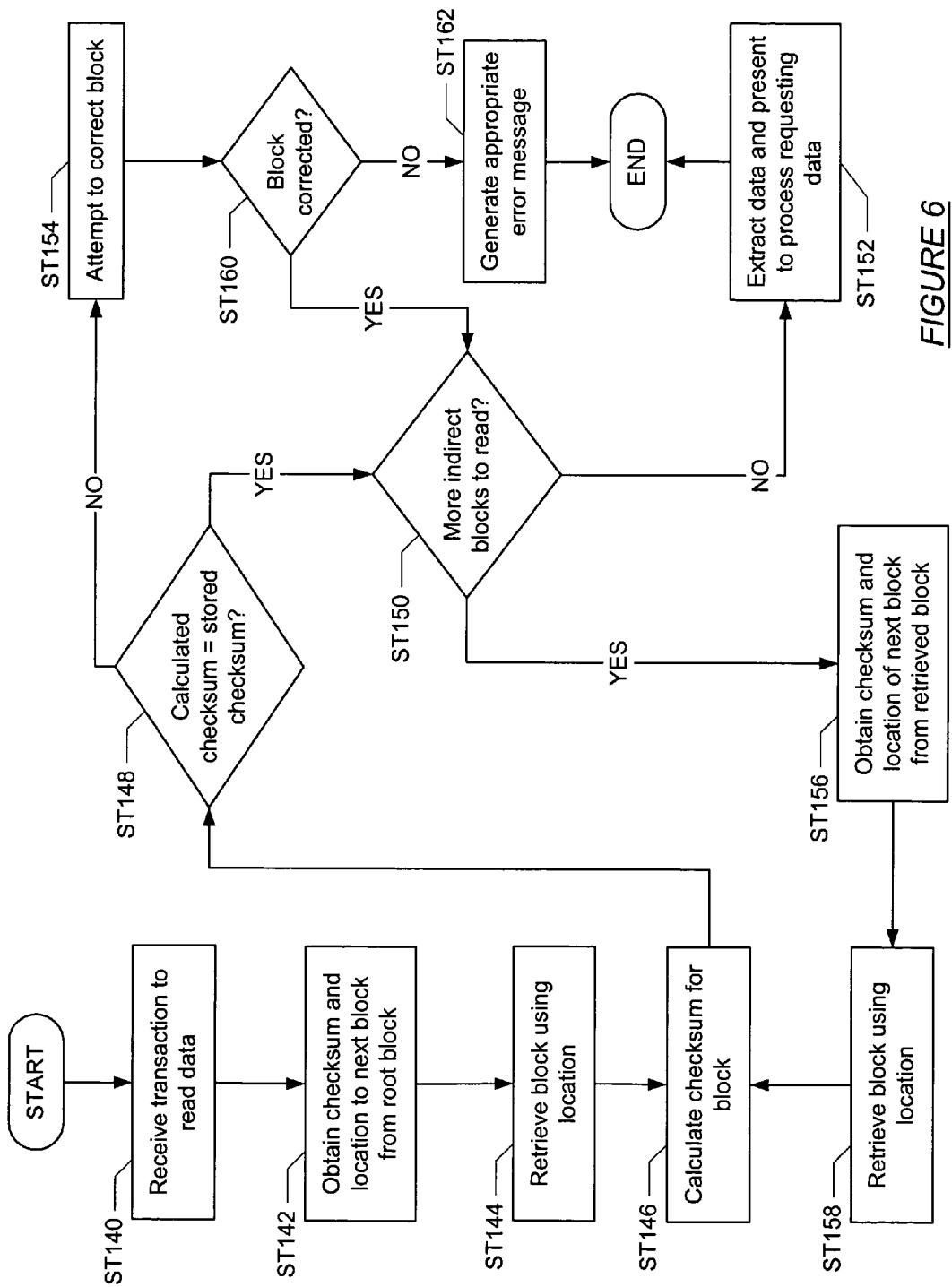
FIG. 6 shows a flow chart in accordance with an embodiment of the invention.

FIG. 6 shows a flow chart in accordance with one embodiment of the invention. More specifically, FIG. 6 details a method for reading data in accordance with one embodiment of the invention. Initially, a transaction to read data is received (Step 140). A checksum and a location to the next block (i.e., a data block or an indirect block) stored in the root block are subsequently retrieved (Step 142). The location (e.g., the metaslab ID and offset) is subsequently used to obtain the block (i.e., the data block or the indirect block) (Step 144). The checksum of the retrieved block is then calculated (Step 146). A determination is subsequently made as to whether the stored checksum is equal to the calculated checksum (Step 148).

If the stored checksum is equal to the calculated checksum, then a determination is made as to whether the retrieved block is a data block (Step 150). If the retrieved block is a data block, then the data is extracted from the data block and presented to the process requesting the data (Step 152). Alternatively, if the retrieved block is not the data block, then the location of the next block (stored within a block pointer within the retrieved block) is obtained (Step 156). The block (data block or indirect block) at the location is subsequently obtained (Step 158). Steps 146-154 are subsequently repeated until either data corruption is encountered (i.e., Step 148) or the data block is encountered (i.e., Step 152).

Figure 7:
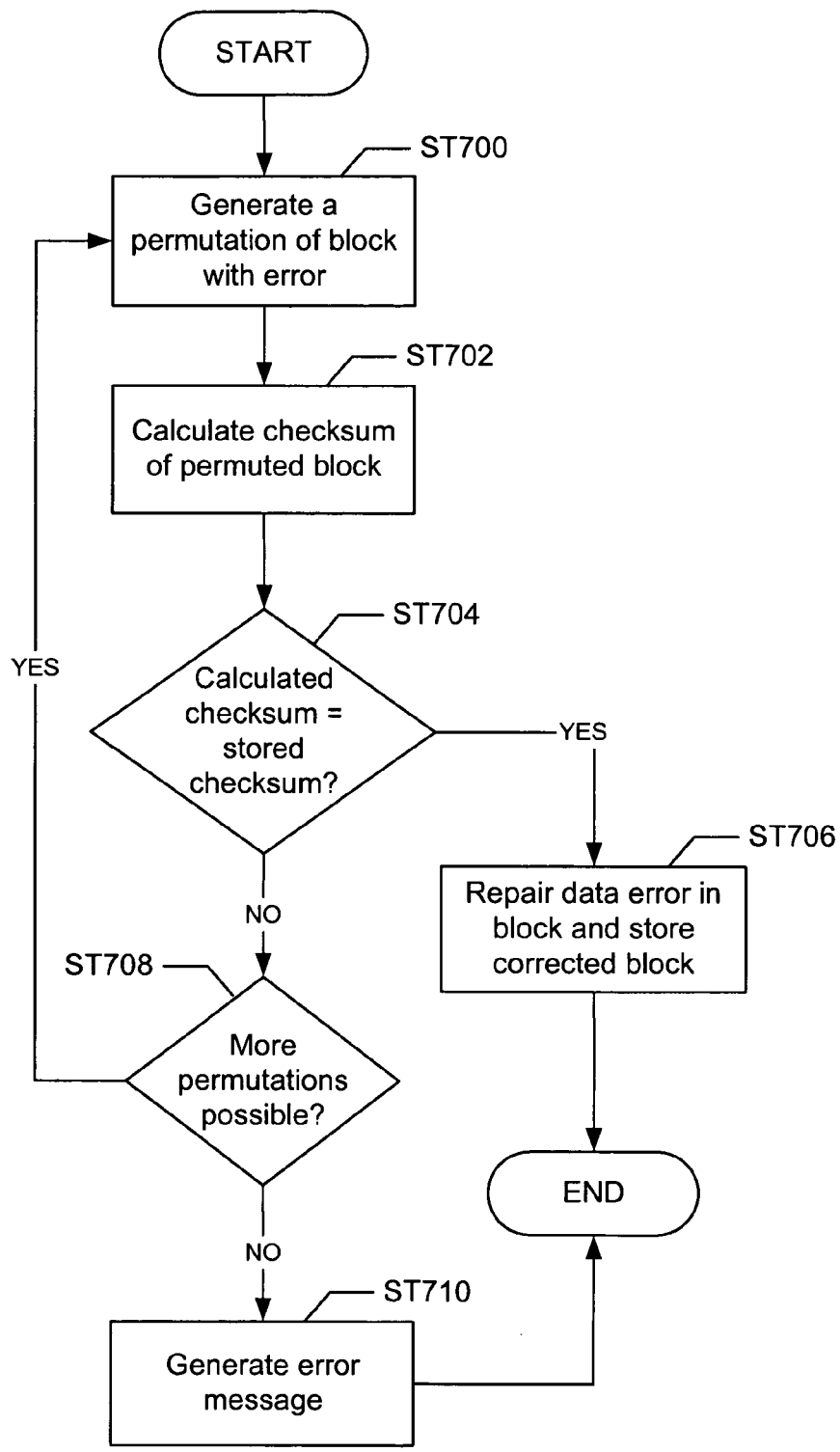
FIG. 7 shows a flow chart for generating permutations in accordance with an embodiment of the invention.

Alternatively, if the stored checksum is not equal to the calculated checksum, then an attempt is made to correct the data or metadata in the block (Step 154) (described in FIG. 7). If the attempt to correct the data in the block is successful (Step 160), then a determination is made as to whether there are more indirect blocks to read (i.e., if the correct block is a data block). If the corrected block is the data block to be read, then the contents of the data block is extracted and presented to the application or process requesting the data (Step 152). Otherwise, steps 148-158 are repeated until the data block is encountered. In contrast, if the attempt to correct the data is not successful (Step 160), an error message is generated notifying the application (or process that requested the particular block) that the data is corrupted or otherwise invalid (Step 162).

FIG. 7 shows a flow chart for correcting data errors in accordance with one embodiment of the invention. Specifically, FIG. 7 describes Step 154 of FIG. 6 in further detail. Initially, when a data error is encountered because the stored checksum does not match the calculated checksum of a particular block, a permutation of the block with the data error is generated (Step 700). The permutation may be any single-bit or double-bit permutation of the data in the block, or any other permutation that would reverse a possible failure mode of the device.

Figure 8A:
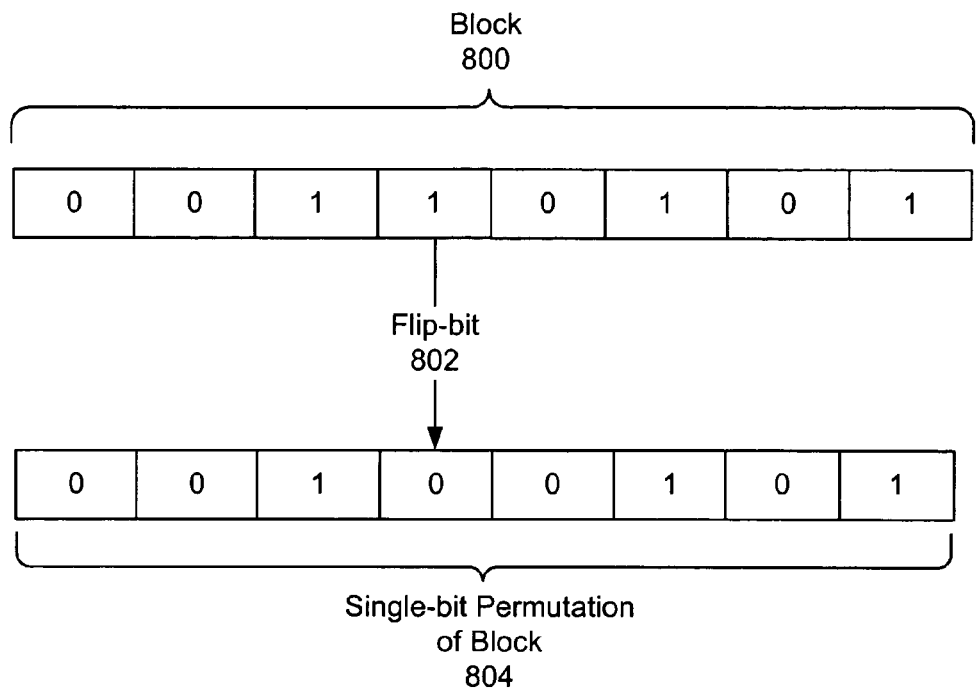
FIG. 8 shows an example of a permutation in accordance with an embodiment of the invention.
Figure 8B:
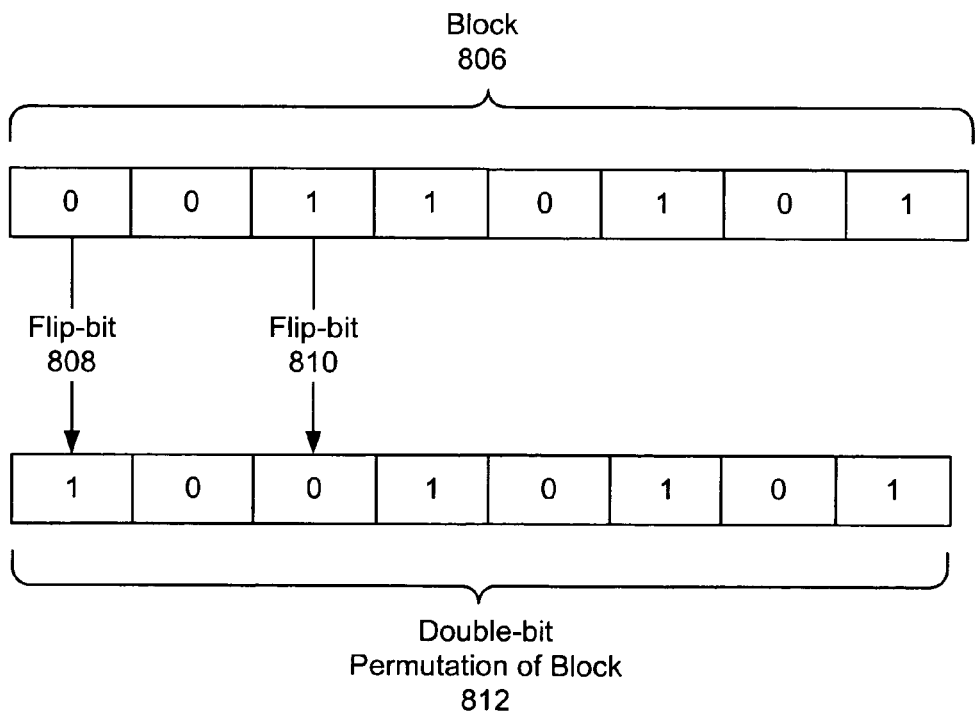

For example, FIG. 8A shows an example of a single-bit permutation of a block (800) in accordance with one embodiment of the invention. In a single-bit permutation, each bit in the block is flipped (i.e., toggled to the alternate value) one at a time. For example, flip-bit (802) forms one possible single-bit permutation (804) of the original block (800). FIG. 8B shows a double-bit permutation in accordance with one embodiment of the invention. Flip-bits (808, 810) have both been changed to form one possible double-bit permutation (812) of the original block (806) of data.

Returning to FIG. 7, once a permutation has been generated for the block with data errors, a checksum is calculated for the permuted block (Step 702). Subsequently, the stored checksum of the block (i.e., the checksum stored in the block pointer associated with the block containing data error) and the checksum calculated based on the permuted block are compared (Step 704). If the checksums match, then the data error may be repaired and the permuted block is stored as the corrected block (Step 706). Alternatively, if the stored checksum and the calculated checksum do not match, a determination is made as to whether more permutations of the block are possible (e.g., more single-bit or double-bit permutations) (Step 708). If more permutations are possible, then Steps 700-704 are repeated to determine whether any of the alternate permutations correct the data error. If no alternate permutations of the block are possible, then an error message is generated notifying the application (or process that requested the particular block) that the data is corrupted or otherwise invalid (Step 710).

Figure 9:
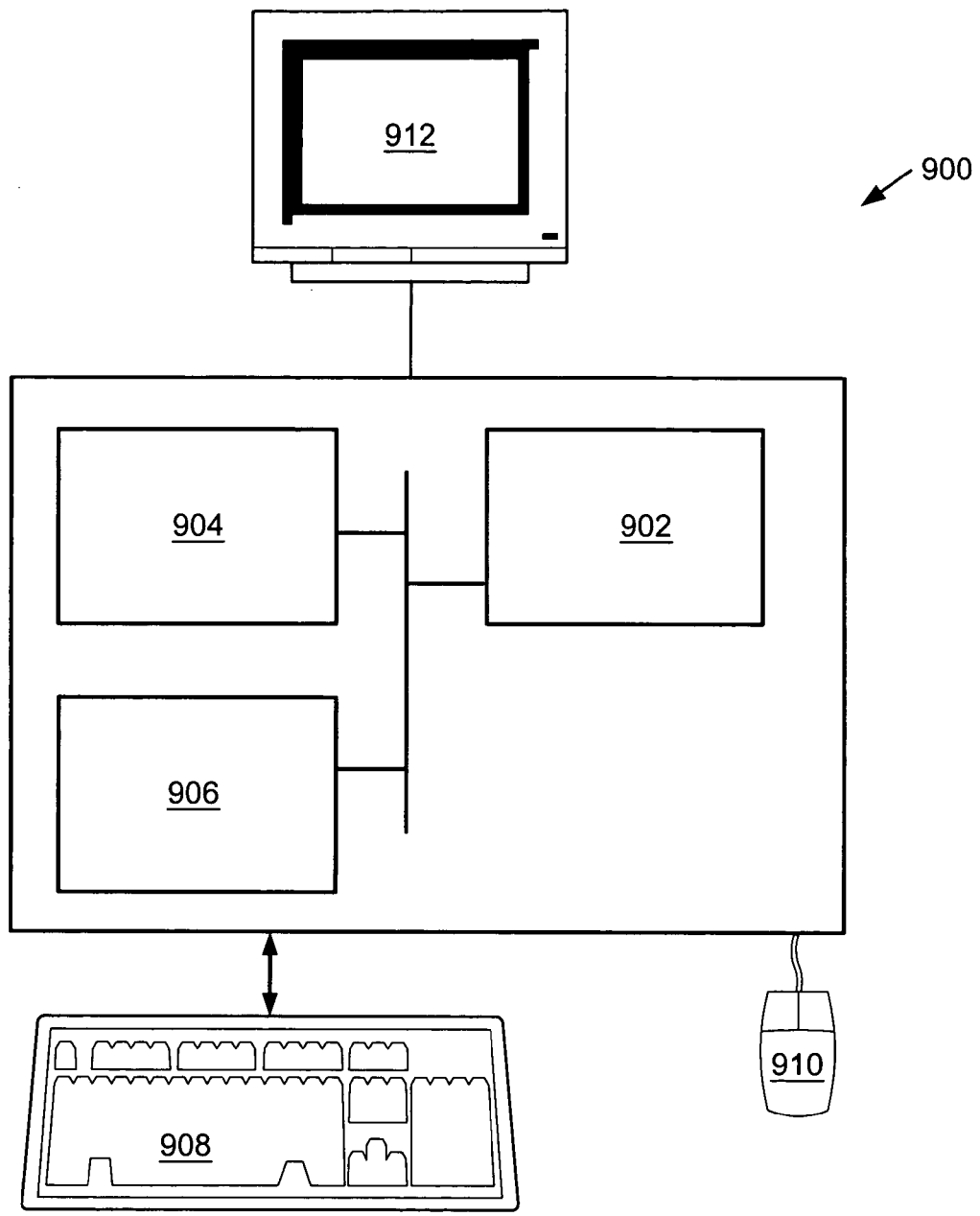
FIG. 9 shows a computer system in accordance with an embodiment of the invention.

An embodiment of the invention may be implemented on virtually any type of computer regardless of the platform being used. For example, as shown in FIG. 9, a networked computer system (900) includes a processor (902), associated memory (904), a storage device (906), and numerous other elements and functionalities typical of today's computers (not shown). The networked computer (900) may also include input means, such as a keyboard (908) and a mouse (910), and output means, such as a monitor (912). The networked computer system (900) is connected to a local area network (LAN) or a wide area network via a network interface connection (not shown). Those skilled in the art will appreciate that these input and output means may take other forms. Further, those skilled in the art will appreciate that one or more elements of the aforementioned computer (900) may be located at a remote location and connected to the other elements over a network. Further, the invention may be implemented on a distributed system having a plurality of nodes, where each portion of the invention (e.g., the storage pool, the SPA, the DMU, etc.) may be located on a different node within the distributed system. In one embodiment of the invention, the node corresponds to a computer system. Alternatively, the node may correspond to a processor with associated physical memory.

Embodiments of the invention may include the ability to correct non-replicated (i.e., data that is not backed-up elsewhere in the file system) data errors efficiently by using data permutations. Additionally, embodiments of the invention use the strength of checksums to automatically correct small bit errors, e.g., single-bit and double-bit errors. By finding and correcting data errors in this manner, the file system is capable of returning good data to the user and repairing the damaged data on disk quicker than correcting errors using replicated data. Further, as technology develops and the processing speed for arithmetic processes increases, computation of multi-bit permutations may allow multi-bit data errors to be corrected at very high speeds.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for correcting an error in a first block comprising:
    detecting an error in the first block;
    generating a first permutation of the first block, wherein generating the first permutation of the first block comprises flipping a first bit of the first block, wherein flipping the first bit comprises one selected from a group consisting of changing the first bit from a zero to a one, when the first bit is a zero, and changing the first bit from a one to a zero, when the first bit is a one;
    calculating a first permutation checksum for the first permutation of the first block; and
    replacing the first block with the first permutation of the first block, when a first block checksum matches the first permutation checksum.

2. The method of claim 1, further comprising:
    generating a second permutation of the first block, when the first block checksum does not match the first permutation checksum, wherein generating the second permutation of the first block comprises flipping a second bit of the first block, wherein flipping the second bit comprises one selected from a group consisting of changing the second bit from a zero to a one, when the second bit is a zero, and changing the second bit from a one to a zero, when the second bit is a one;
    calculating a second permutation checksum for the second permutation of the first block; and
    replacing the first block with the second permutation of the first block, when a first block checksum matches the second permutation checksum.

3. The method of claim 1, further comprising:
    storing the first block in a storage pool;
    obtaining the first block location;
    calculating the first block checksum for the first block; and
    storing a second block in the storage pool, wherein the second block comprises the first block location and the first block checksum.

4. The method of claim 3, further comprising:
    assembling the first block.

5. The method of claim 4, wherein assembling the first block comprises
    storing the first block checksum in a checksum field within a block pointer, and
    storing the first block location in the block pointer, wherein storing the data location comprises storing a metaslab ID and offset.

6. The method of claim 5, further comprising:
    storing a birth value in a birth field within the block pointer.

7. The method of claim 4, wherein the first block is assembled using a data management unit.

8. The method of claim 3, wherein the storage pool comprises at least one disk.

9. The method of claim 3, wherein the storage pool is divided into a plurality of metaslabs.

10. The method of claim 9, wherein each of the plurality of metaslabs is associated with a metaslab ID.

11. The method of claim 9, wherein the data block location comprises the metaslab ID and an offset.

12. The method of claim 1, wherein storing the data block comprises using a storage pool allocator.

13. The method of claim 1, wherein detecting the error in the block comprises:
    calculating a checksum for the block; and
    determining whether the checksum for the block equals the block checksum.

14. The method of claim 1, wherein the block is one selected from the group consisting of a data block and an indirect block.

15. A method for retrieving data in a data block, comprising:
    obtaining an indirect block comprising a stored checksum and a data block location;
    obtaining the data block using the data block location;
    calculating the checksum for the data block to obtain a calculated checksum;
    retrieving the data from the data block, if the stored checksum equals the calculated checksum; and
    performing error correction, if the stored checksum is not equal to the calculated checksum, wherein performing error correction comprises:
        generating a permutation of the data block, wherein generating the permutation of the data block comprises flipping at least one bit of the data block, wherein flipping the at least one bit comprises one selected from a group consisting of changing the at least one bit from a zero to a one, when the at least one bit is a zero, and changing the at least one bit from a one to a zero, when the at least one bit is a one;
        calculating a permutation checksum for the permutation of the data block; and
        replacing the data block with the permutation of the data block, when the stored checksum matches the permutation checksum.

16. The method of claim 15, wherein the calculated checksum is calculated using a storage pool allocator.

17. A system for correcting an error in a first block, comprising:
    a storage pool comprising the first block and a second block, wherein the second block comprises a first block checksum and a first block location;
    a storage pool allocator configured to store the first block and the second block in the storage pool; and
    a data management unit configured to correct the error in the first block, if the error is detected,
    wherein the error in the first block is corrected by generating a permutation of the first block, wherein generating the permutation of the first block comprises flipping at least one bit of the first block, wherein flipping the at least one bit comprises one selected from a group consisting of changing the at least one bit from a zero to a one, when the at least one bit is a zero, and changing the at least one bit from a one to a zero, when the at least one bit is a one, calculating a permutation checksum for the permutation of the first block, comparing the permutation checksum to the first block checksum, and replacing the first block with the permutation of the first block, when the permutation checksum matches the first block checksum.

18. The system of claim 17, wherein the first block is one selected from the group consisting of a data block and an indirect block.

19. The system of claim 17, wherein the storage pool comprises at least one disk.

20. The system of claim 17, wherein the error in the first block is corrected by:
   storing the first block in a storage pool;
   obtaining the first block location;
   calculating the first block checksum for the first block; and
   storing a second block in the storage pool, wherein the second block comprises the first block location and the first block checksum.

21. The system of claim 17, wherein the storage pool is divided into a plurality of metaslabs.

22. A computer system for correcting an error in a first block, comprising:
   a processor;
   a memory;
   a storage device; and
   software instructions stored in the memory for enabling the computer system under control of the processor, to:
      detect an error in the first block;
      generate a permutation of the first block, wherein generating the permutation of the first block comprises flipping a first bit of the first block, wherein flipping the first bit comprises one selected from a group consisting of changing the first bit from a zero to a one, when the first bit is a zero, and changing the first bit from a one to a zero, when the first bit is a one;
      calculate a permutation checksum for the permutation of the first block; and
      replace the first block with the permutation of the first block, when a first block checksum matches the permutation checksum.

23. A network system having a plurality of nodes, comprising:
   a storage pool comprising the first block and a second block, wherein the second block comprises a first block checksum and a first block location;
   a storage pool allocator configured to store the first block and the second block in the storage pool; and
   a data management unit configured to correct the error in the first block, if the error is detected,
   wherein the error in the first block is corrected by generating a permutation of the first block, wherein generating the permutation of the first block comprises flipping at least one bit of the first block, wherein flipping the at least one bit comprises one selected from a group consisting of changing the at least one bit from a zero to a one, when the at least one bit is a zero, and changing the at least one bit from a one to a zero, when the at least one bit is a one, calculating a permutation checksum for the permutation of the first block, comparing the permutation checksum to the first block checksum, and replacing the first block with the permutation of the first block when the permutation checksum matches the first block checksum,
   wherein the storage pool is located on any one of the plurality of nodes, and wherein the storage pool allocator is located on any one of the plurality of nodes.

* * * * *